United States Patent [19]

Patterson, III

[11] Patent Number: 4,471,236

[45] Date of Patent: Sep. 11, 1984

[54] HIGH TEMPERATURE BIAS LINE STABILIZED CURRENT SOURCES

[75] Inventor: Raymond B. Patterson, III, Melbourne, Fla.

[73] Assignee: Harris Corporation, Melbourne, Fla.

[21] Appl. No.: 351,442

[22] Filed: Feb. 23, 1982

[51] Int. Cl.³ .............................................. H03K 3/01
[52] U.S. Cl. ................................. 307/310; 307/296 R; 323/315
[58] Field of Search ................ 307/310, 296; 330/256, 330/266, 272, 289; 323/313–315

[56] References Cited

U.S. PATENT DOCUMENTS

| | | | |
|---|---|---|---|
| 3,825,778 | 7/1974 | Ahmed | 307/310 |
| 3,921,013 | 11/1975 | Ahmed | 307/296 |
| 4,028,564 | 6/1977 | Streit et al. | 307/310 |
| 4,177,417 | 12/1979 | Henry et al. | 323/315 |
| 4,198,581 | 4/1980 | Ahmed | 307/310 |
| 4,274,018 | 6/1981 | Cave et al. | 307/300 |
| 4,287,438 | 9/1981 | Cave et al. | 307/310 |

Primary Examiner—Stanley D. Miller
Assistant Examiner—B. P. Davis
Attorney, Agent, or Firm—Barnes & Thornburg

[57] ABSTRACT

A compensation device for the base of emitter follower configured bipolar transistors becoming operable at elevated temperatures including a bipolar transistor of a geometry of not more than half the geometry of the bipolar emitter follower having its collector connected to the base of the emitter follower and its base and emitter connected together and to the emitter of the emitter follower.

10 Claims, 1 Drawing Figure

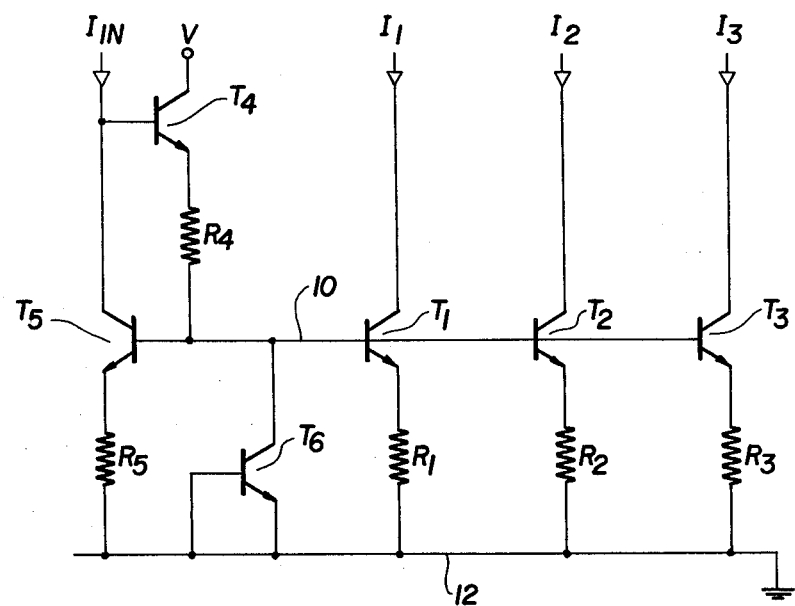

HIGH TEMPERATURE BIAS LINE STABILIZED CURRENT SOURCES

The Government has rights in this invention pursuant to Contract No. DE-AC04-76DP00789 awarded by the U.S. Department of Energy.

BACKGROUND OF THE INVENTION

The present invention relates generally to leakage current compensation devices for integrated circuit current sources and, more specifically, for a compensation device operating in a higher than normal temperature range.

It is well-known that the operating characteristics of semiconductor devices vary with heat. The leakage current of elements rises approximately exponentially with temperature. Thus, it is well-known to provide bypass devices for digital circuits and compensation elements for analog circuits to handle the large leakage current. Earlier attempts have been made to provide bypass through resistive elements. This has been found undesirable and the use of semiconductor devices for the bypass element has been suggested.

A typical example of the semiconductor element being used as a bypass element to compensate monolithic integrated current sources is described in U.S. Pat. No. 4,028,564 to Streit et al. Of particular interest are the embodiments of FIGS. 5a and 5b. In FIG. 5a, a transistor 29 with a short circuited base emitter diode is used effectively as the same as the base collector diode of FIG. 4e. To sink much greater currents, FIG. 5b shows a transistor 30 with an open base connection such that amplification factor is provided for the leakage current such that the geometry of transistor 30 may be smaller than that of transistor 1 whose base current is to be sunk.

The temperature environment for which Streit et al were designing was normal operating temperatures of the integrated circuit. These types of circuits have generally been temperature tested for the military range which is $-55°$ C. to $+125°$ C.

There is a growing need for electronics which operate in the range of 125° C. to 300° C. Such applications include well logging, jet engine control and industrial process controls. These temperatures are substantially higher than the normal operating range and even the military range. Prior art circuits have not addressed the problems associated with these extreme temperature environments. For example, PN junction leakage currents double approximately every 11° C. and can reach microamp levels above 200° C. even for small junctions. Currents of this magnitude may defeat the operation of sensitive low level circuitry.

The resistivities of the various regions of the integrated circuit increase with temperature. The lightly doped regions such as IC substrates and collector regions of transistors have the largest temperature coefficient, increasing approximately a factor of four over the 25° C. to 200° C. range. Transistors designed to remain in the linear region of operation will often saturate when operated above their design temperature at minimum collector-base voltage due to this effect.

The forward voltage of a PN diode has a strong negative temperature coefficient of about 2 mv/°C. At 200° C. $V_F$ of a diode and $V_{BE}$ of a transistor drop below 250 mv. Devices whose bias is generated from diode voltages may saturate due to this effect. Furthermore, the noise margin of the many logic circuits which depend upon them drop to very low values at temperatures above 200° C.

$H_{FE}$ increases with temperature. A typical integrated circuit NPN $H_{FE}$ will somewhat more than double as temperature is increased from 25° C. to 200° C. A device with a high $H_{FE}$ operating at a low collector current such as might be found, for example, in the front end of an operational amplifier may experience a reversal of base current due to collector base leakage under these conditions.

SUMMARY OF THE INVENTION

An object of the present invention is to provide a compensated current source for operating in the 125° C. to 300° C. temperature range.

Another object of the present invention is to provide a unique compensation device of a minimum geometry to compensate for large leakage currents in the temperature range of 125° C. to 300° C.

These and other objects of the invention are attained by placing a bipolar transistor having its collector connected to the common base bias line of a plurality of bipolar current sources and its base and emitter connected together to a common power terminal of the current sources. The geometry of the bipolar compensation device is not more than half the sum of the geometries of the plurality of bipolar current sources. In the elevated temperature range, the bipolar compensation device base current reverses and the current sunk by such a device is increased 4 to 20 times because of the base-emitter amplification factor. The temperature at which the base emitter diode becomes operable to provide the amplification factor is the intrinsic temperature range determined by the impurity concentration of the collector. Thus, the bipolar compensation device is inoperative below a fixed temperature and is operable above the temperature to provide a sink for the excessive leakage currents of the bipolar current sources at the high temperature.

Other objects, advantages and novel features of the present invention will become evident from the following detailed description of the preferred embodiment in conjunction with the accompanying drawing.

BRIEF DESCRIPTION OF THE DRAWING

The FIGURE is a schematic of a plurality of current sources incorporating the compensation device according to the principles of the present invention.

DESCRIPTION OF THE PREFERRED EMBODIMENTS

A plurality of bipolar current sources are illustrated in the FIGURE as including transistors T1, T2 and T3. The bases of the transistors T1, T2 and T3 are connected to a common base bias line 10. The emitters of the transistors T1, T2 and T3 are connected to a common supply line 12 through resistors R1, R2 and R3, respectively. These bipolar current sources draw current I1, I2 and I3 through their collectors. The magnitude of the current is proportional to the geometry of transistors T1, T2 and T3. The current bias for the bias line 10 is provided by an emitter follower bipolar transistor T4 having its emitter connected to the common base bias line 10 by resistor R4 and having its base connected to an input reference current $I_{IN}$. The collector is connected to a voltage source V. A negative feedback amplifier consists of transistor T5 having its base connected to the common base line 10, its collector connected to the input reference current $I_{IN}$ and to the base of T4 and its emitter connected through resistor R5 to the supply line 12.

At temperatures between 200° C. and 300° C., the base current of the bipolar transistors T1, T2 and T3 operating at nominal collector currents reverses its normal direction of flow because of an increase in the collector-base junction leakage and an increase in the grounded emitter current gain. This results in a runaway condition on the common base bias line 10 since the transistors T4 and T5 cannot provide for the reversed current. A compensation circuit must be provided on the common base bias line 10 to sink this current reversal so as to maintain the transistors T1, T2, T3 out of saturation and operating in their normal range.

A compensation device as illustrated in the FIGURE is a transistor T6 having its collector connected to the common base bias line 10 and its base and emitter shorted together and connected to the supply line 12. In the normal operating range of the prior art, namely, below a 125° C., the compensation bipolar transistor T6 operates as a base-collector diode connected between the common base bias line 10 and the voltage reference line 12. At elevated temperatures in the 200° C. to 300° C. temperature range, the compensation bipolar device T6 will sink from 4 to 20 times the collector-to-base leakage of devices of the same type geometry. Thus, the geometry of T6 can be at least one quarter smaller than of the sum of the geometries T1, T2 and T3.

The reason for this multiplicative effect is the rise in the concentration of thermally generated hole-electron pairs in the collector region to a significant number with respect to the impurity concentration. The resistivity of the doped semiconductor layers increases until the intrinsic carrier density, $n_i$ which has exponential temperature dependence is approximately equal to the doping impurity concentration N. Above the temperature, called the intrinsic temperature, at which this occurs, resistivity begins to decline rapidly due to the increased total carrier concentration $N+n_i$. The smaller N, the lower the intrinsic temperature. For 4 ohm-cm material which is commonly used for linear NPN collectors and CMOS substrates, the maximum resistivity of 12 ohm-cm occurs at about 200° C. and $n_i=N$ at about 325° C. where resistivity is back down to about 4 ohm-cm.

Also, in this temperature range minority carriers diffusing into the collector-base depletion region are accelerated by the depletion region and given a velocity which causes them to move through the base and the base-emitter depletion region into the emitter where recombination is highly probable because of the short lifetime of the minority carriers in the heavily doped emitter material. This consitutes a flow of current from the collector to the emitter. Thus, the compensation device T6 changes its configuration from a base-collector diode to a device conducting between the collector and emitter region. Thus, in effect, the amplification factor of the collector-to-emitter path is provided at a raised temperature which was not available at a lower temperature.

In prior art devices, for example, in the Streit et al patent, discussed above, the use of a shorted base-emitter transistor was only recognized as a base-collector diode equivalent to other diode configurations of the prior art. In order to accommodate higher current flows, the prior art as in Streit et al, used a floating base transistor which took advantage of the collector-to-emitter amplification factor. If a floating base device was used as the compensation device in the FIGURE, at the elevated temperature range of 200° C. to 300° C. the sinking capability of the device would be a hundred times the leakage current of an equivalent transistor. Thus, such a device would sink more current than is available from the leakage currents of the three current sources T1, T2 and T3 and the emitter follower T4 could not provide the extra current which is being sunk by the compensation device. Thus, the solution of the prior art is not feasible at the higher temperature range of the present invention. By tying the base in common with the emitter, the amplification of the current by the compensating device is maintained at an appropriate level.

Since the phenomenon which makes the bipolar compensating device T6 operable is a temperature at which the lightly doped collector becomes intrinsic, the operating point or intrinsic temperature of the compensation device T6 may be selected by adjusting the impurity concentration of the collector. As discussed above, for a collector having a resistance of 4 ohm-cm, a bipolar compensation device T6 begins to conduct more heavily at about 175° C. and maximizes at 200° C.

Although the bipolar compensation device T6 has been described to compensate for the rise of leakage current on a common base bias line of a plurality of current sources at high temperatures, it can be used to track and compensate for the rise of leakage current on any bias line in an integrated circuit wherein the geometry of the compensation device is substantially less than the geometry of the other devices and the compensation device becomes operable above a selected temperature.

It is evident from the description of the preferred embodiment, that the objects of the invention are attained. Although the invention has been described and illustrated in detail, it is clearly understood that the same is by way of illustration and example only and is not to be taken by way of limitation. Although the bipolar current sources T1, T2 and T3 have been illustrated as NPN transistors and the compensation device T6 is an NPN transistor, it is evident that the current sources and the compensation device may also be formed from PNP transistors. The principles of the present invention are equally applicable thereto.

The spirit and scope of the present invention are to be limited only by the terms of the appended claims.

What is claimed is:

1. Bias line stabilized current sources comprising:
   a plurality of bipolar transistor current sources, each having a base and having an emitter connected to a power supply terminal;
   bias means connected to all of the bases of said current sources for biasing said current sources; and
   compensation means connected to all of the bases of said current sources for tracking and compensation the base current and including a bipolar transistor having a collector connected to all of the bases of said current sources and having a base and an emitter connected together and to said power supply terminal, said compensation means being operative above a selected temperature and inoperative below said selected temperature.

2. The bias line stabilized current sources according to claim 1, wherein said selected temperature is 125° C.

3. The bias line stabilized current sources according to claim 2, wherein the impurity concentration of the collector region of said bipolar transistor of said compensation means determines said selected temperature of operability of said compensation means.

4. In an integrated circuit including at least one bipolar transistor having a collector, base and emitter connected in an emitter follower configuration, the improvement comprising compensation means connected to the base of said emitter follower transistor for tracking and compensating the base current of said emitter follower transistor and including a bipolar transistor having a collector connected to the base of said emitter follower transistor and having a base and an emitter connected together and to said emitter of said emitter follower transistor said compensation means being operative above a selected temperature and inoperative below said selected temperature.

5. The integrated circuit according to claim 4, wherein said selected temperature is 125° C.

6. The integrated circuit according to claim 5, wherein the impurity concentration of the collector region of said bipolar transistor of said compensation means determines said selected temperature of operability of said compensation means.

7. Bias line stabilized current sources comprising:
a plurality of bipolar transistor current sources, each having a base and having an emitter connected to a power supply terminal;
bias means connected to all of the bases of said current sources for biasing said current sources; and
compensation means connected to all of the bases of said current sources for tracking and compensating the base current and including a bipolar transistor having a collector connected to all of the bases of said current sources and having a base and an emitter connected together and to said power supply terminal, wherein said bipolar transistor current sources and said bipolar transistor of said compensation means being of the same type, and wherein said bipolar transistor of said compensation means has the same impurity concentrations as said bipolar transistor current sources.

8. In an integrated circuit including at least one bipolar transistor having a collector, base and emitter connected in an emitter follower configuration, the improvement comprising compensation means connected to the base of said emitter follower transistor for tracking and compensating the base current of said emitter follower transistor and including a bipolar transistor having a collector connected to the base of said emitter follower transistor and having a base and an emitter connected together and to said emitter of said emitter follower transistor, wherein said emitter follower transistor and said bipolar transistor of said compensation means are of the same type, and wherein said bipolar transistor of said compensation means has the same impurity concentrations as said emitter follower transistor.

9. The bias line stabilized current sources according to claim 1, wherein the geometry of said bipolar transistor of said compensation means is not more than half the sum of the geometries of the bipolar transistor current sources.

10. The integrated circuit according to claim 4, wherein the geometry of said bipolar transistor of said compensation means is not more than half the geometry of said emitter follower transistor.

* * * * *